United States Patent
Asher et al.

(10) Patent No.: US 7,370,151 B2
(45) Date of Patent: May 6, 2008

(54) METHOD AND SYSTEM FOR ABSORBING DEFECTS IN HIGH PERFORMANCE MICROPROCESSOR WITH A LARGE N-WAY SET ASSOCIATIVE CACHE

(75) Inventors: David H. Asher, Sutton, MA (US); Brian Lilly, Marlborough, MA (US); Joel Grodstein, Arlington, MA (US); Patrick M. Fitzgerald, E. Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 713 days.

(21) Appl. No.: 10/690,137

(22) Filed: Oct. 21, 2003

(65) Prior Publication Data

US 2004/0088603 A1 May 6, 2004

Related U.S. Application Data

(63) Continuation of application No. 09/651,948, filed on Aug. 31, 2000, now Pat. No. 6,671,822.

(51) Int. Cl.
*G06F 13/00* (2006.01)
(52) U.S. Cl. .............. 711/128; 711/100; 711/111; 711/118; 365/49; 714/2; 714/5; 714/41; 714/42
(58) Field of Classification Search .......... 711/128, 711/118, 11, 100, 111; 365/49; 714/2, 5, 714/41, 42
See application file for complete search history.

(56) References Cited

U.S. PATENT DOCUMENTS

| | | | |
|---|---|---|---|
| 5,070,502 A | 12/1991 | Supnik | 714/8 |
| 5,261,066 A | 11/1993 | Jouppi et al. | 395/425 |
| 5,317,718 A | 5/1994 | Jouppi | 395/425 |
| 5,617,531 A * | 4/1997 | Crouch et al. | 714/30 |
| 5,666,482 A | 9/1997 | McClure | 714/8 |
| 5,758,183 A | 5/1998 | Scales | 395/825 |
| 5,761,729 A | 6/1998 | Scales | 711/148 |
| 5,787,480 A | 7/1998 | Scales et al. | 711/148 |
| 5,802,585 A | 9/1998 | Scales et al. | 711/154 |

(Continued)

OTHER PUBLICATIONS

*Alpha Architecture Reference Manual*, Third Edition, The Alpha Architecture Committee, 1998 Digital Equipment Corporation (21 p.), in particular pp. 3-1 through 3-15.
*A Logic Design Structure For LSI Testability*, E. B. Eichelberger et al., 1977 IEEE (pp. 462-468).
*Direct RDRAM™ 256/288-Mbit (512K×16/18×32s)*, Preliminary Information Document DL0060 Version 1.01 (69 p.).
*Testability Features of AMD-K6™ Microprocessor* R. S. Fetherston et al., Advanced Micro Devices (8 p.).

(Continued)

Primary Examiner—Stephen C. Elmore
Assistant Examiner—Daniel Kim

(57) ABSTRACT

A method and architecture for improving the usability and manufacturing yield of a microprocessor having a large on-chip n-way set associative cache. The architecture provides a method for working around defects in the portion of the die allocated to the data array of the cache. In particular, by adding a plurality of muxes to a way or ways in the data array of an associative cache having the shorter paths to the access control logic, each way in a bank can be selectively replaced or remapped to the ways with the shorter paths without adding any latency to the system. This selective remapping of separate ways in individual banks of the set associative cache provides a more efficient way to absorb defects and allows more defects to be absorbed in the data array of a set associative cache.

18 Claims, 2 Drawing Sheets

U.S. PATENT DOCUMENTS

| | | | |
|---|---|---|---|
| 5,809,450 A | 9/1998 | Chrysos et al. | 702/186 |
| 5,835,948 A * | 11/1998 | Olarig et al. | 711/128 |
| 5,875,151 A | 2/1999 | Mick | 365/233 |
| 5,890,201 A | 3/1999 | McLellan et al. | 711/108 |
| 5,893,931 A | 4/1999 | Peng et al. | 711/206 |
| 5,918,250 A | 6/1999 | Hammond | 711/205 |
| 5,918,251 A | 6/1999 | Yamada et al. | 711/207 |
| 5,923,872 A | 7/1999 | Chrysos et al. | 395/591 |
| 5,950,228 A | 9/1999 | Scales et al. | 711/148 |
| 5,953,745 A | 9/1999 | Lattimore et al. | 711/162 |
| 5,958,068 A | 9/1999 | Arimilli et al. | 714/8 |
| 5,964,867 A | 10/1999 | Anderson et al. | 712/219 |
| 5,983,325 A | 11/1999 | Lewchuk | 711/137 |
| 6,000,044 A | 12/1999 | Chrysos et al. | 714/47 |
| 6,055,204 A | 4/2000 | Bosshart | 365/230.06 |
| 6,070,227 A | 5/2000 | Rokicki | 711/117 |
| 6,085,300 A | 7/2000 | Sunaga et al. | 711/168 |
| 6,256,728 B1 * | 7/2001 | Witt et al. | 712/236 |
| 6,351,797 B1 | 2/2002 | Beard et al. | 711/207 |
| 6,381,669 B1 * | 4/2002 | Chudnovsky et al. | 711/5 |
| 6,748,492 B1 * | 6/2004 | Rowlands et al. | 711/128 |
| 6,965,969 B2 * | 11/2005 | Burger et al. | 711/128 |
| 2003/0154345 A1 * | 8/2003 | Lyon | 711/122 |
| 2003/0196143 A1 * | 10/2003 | Puri et al. | 714/30 |

OTHER PUBLICATIONS

*Hardware Fault Containment in Scalable Shared-Memory Multiprocessors*, D. Teodosiu et al., Computer Systems Laboratory, Stanford University (12 p.), 1977.

*Cellular Disco: resource management using virtual clusters on shared-memory multiprocessors*, K. Govil et al., 1999 ACM 1-58113-140-2/99/0012 (16 p.).

*Are Your PLDs Metastable?*, Cypress Semiconductor Corporation, Mar. 6, 1997 (19 p.).

*Rambus® RIMM™ Module* (with 128/144Mb RDRAMs), Preliminary Information, Document DL0084 Version 1.1 (12 p.).

*Direct Rambus™ RIMM™ Module Specification Version 1.0*, Rambus Inc., SL-0006-100 (32 p.), 2000.

*End-To-End Fault Containment In Scalable Shared-Memory Multiprocessors*, D. Teodosiu, Jul. 2000 (148 p.).

* cited by examiner

METHOD AND SYSTEM FOR ABSORBING DEFECTS IN HIGH PERFORMANCE MICROPROCESSOR WITH A LARGE N-WAY SET ASSOCIATIVE CACHE

CROSS-REFERENCE TO RELATED APPLICATIONS

This application is a continuation of U.S. patent application Ser. No. 09/651,948, filed on Aug. 31, 2000, and issued as U.S. Pat. No. 6,671,822.

This application relates to the following commonly assigned co-pending applications entitled:

"Apparatus And Method For Interfacing A High Speed Scan-Path With Slow Speed Test Equipment," Ser. No. 09/653,642, filed Aug. 31, 2000; "Priority Rules For Reducing Network Message Routing Latency," Ser. No. 09/652,322, filed Aug. 31, 2000; "Scalable Directory Based Cache Coherence Protocol," Ser. No. 09/652,703, filed Aug. 31, 2000; "Scalable Efficient I/O Port Protocol," Ser. No. 09/652,391, filed Aug. 31, 2000; "Efficient Translation Lookaside Buffer Miss Processing In Computer Systems With A Large Range Of Page Sizes," Ser. No. 09/652,552, filed Aug. 31, 2000; "Fault Containment And Error Recovery Techniques In A Scalable Multiprocessor," Ser. No. 09/651,949, filed Aug. 31, 2000; "Speculative Directory Writes In A Directory Based Cache Coherent Nonuniform Memory Access Protocol," Ser. No. 09/652,834, filed Aug. 31, 2000; "Special Encoding Of Known Bad Data," Ser. No. 09/652,314, filed Aug. 31, 2000; "Broadcast Invalidate Scheme," Ser. No. 09/652,165, filed Aug. 31, 2000; "Mechanism To Track All Open Pages In A DRAM Memory System," Ser. No. 09/652,704, filed Aug. 31, 2000; "Programmable DRAM Address Mapping Mechanism," Ser. No. 09/653,093, filed Aug. 31, 2000; "Computer Architecture And System For Efficient Management Of Bi-Directional Bus," Ser. No. 09/652,323, filed Aug. 31, 2000; "An Efficient Address Interleaving With Simultaneous Multiple Locality Options," Ser. No. 09/652,452, filed Aug. 31, 2000; A High Performance Way Allocation Strategy For A Multi-Way Associative Cache System," Ser. No. 09/653,092, filed Aug. 31, 2000; "A Method For Reducing Directory Writes And Latency In A High Performance, Directory-Based, Coherency Protocol," Ser. No. 09/652,324, filed Aug. 31, 2000; "Mechanism To Reorder Memory Read And Write Transactions For Reduced Latency And Increased Bandwidth," Ser. No. 09/653,094, filed Aug. 31, 2000; "System For Minimizing Memory Bank Conflicts In A Computer System," Ser. No. 09/652,325, filed Aug. 31, 2000; "Computer Resource Management And Allocation System," Ser. No. 09/651,945, filed Aug. 31, 2000; "Input Data Recovery Scheme," Ser. No. 09/653,643, filed Aug. 31, 2000; "Fast Lane Prefetching," Ser. No. 09/652,451, filed Aug. 31, 2000; "Mechanism For Synchronizing Multiple Skewed Source-Synchronous Data Channels With Automatic Initialization Feature," Ser. No. 09/652,480, filed Aug. 31, 2000; "Mechanism To Control The Allocation Of An N-Source Shared Buffer," Ser. No. 09/651,924, filed Aug. 31, 2000; and "Chaining Directory Reads And Writes To Reduce DRAM Bandwidth In A Directory Based CC-NUMA Protocol," Ser. No. 09/652,315, filed Aug. 31, 2000, all of which are incorporated by reference herein.

STATEMENT REGARDING FEDERALLY SPONSORED RESEARCH OR DEVELOPMENT

Not applicable.

BACKGROUND OF THE INVENTION

1. Field of the Invention

The present invention generally relates to a method and architecture for absorbing defects and improving the yield of a microprocessor having a large on-chip cache. More particularly, the invention relates to improving the yield of a microprocessor having a large on-chip n-way set associative cache by absorbing or working around defects in the portion of the die allocated to cache.

2. Background of the Invention

In general, when designing microprocessor-based systems, system performance can be enhanced by increasing the random access memory ("RAM") cache available on-chip to the microprocessor. This is because accessing on-chip cache is significantly faster than accessing other off-chip memory, such as single inline memory modules ("SIMMs") or dual inline memory modules ("DIMMs"). So, at the risk of over-simplifying, the more on-chip cache available the better.

The problem is that increasing available on-chip cache results in increasing the die size for the microprocessor. As the size of the die increases, generally the manufacturing yields for the die decrease. In fact, typically the yield goes down exponentially as the die size is increased. This means that it is harder to manufacture large dies that are not defective.

This creates two competing interests in the design of microprocessors. On the one hand, one would like as much cache as possible available on-chip to increase the speed and efficiency of the microprocessor. On the other hand, any increase in the die size will probably result in reduced production yields for the microprocessor. Industry testing has indicated that for up to about 4 megabytes of cache, the return on speed and efficiency is often worth the resultant manufacturing issues. After that cache size, however, there may be diminishing returns. That is, the benefits of the increased cache size may be outweighed by the reduction in manufacturing yields. Ultimately, a general rule would be that one wants as much cache as can fit on the die while maintaining acceptable production yields.

On typical microprocessor dies, then, large areas of the die are allocated to the cache. In fact, the cache typically takes up more physical real estate on the die than anything else. This necessarily means that manufacturing defects in a given microprocessor will often occur in the cache portion of the die since it is the largest physical portion of the die. Accordingly, if there was some way to organize and manage the cache to work around these defects, production yields could be increased. Any method or system that increases the number of defects which a die can absorb while still functioning properly will have a significant yield benefit.

The state of the art currently provides for segmenting the data array of the cache to allow the cache to absorb or "work around" some defects in the data array of the cache. In particular, segmenting the data array of the cache allows for some redundancy and selectivity in the data array that allows the cache to work around some unrepairable defects. For example, by assigning rows and columns to the data array of the cache, row and column redundancy can be used to replace defective rows or columns of the data array. That is, where a particular row or column is found to have an unrepairable defect, it can be replaced with one of the redundant rows or columns that is not defective. Additionally, in a set associative cache where the data array is divided into a plurality of sets or ways, any way found to have a defect can be disabled. This allows an otherwise defective die to still be used, although with a smaller usable cache.

The present invention is directed at a method and architecture for working around defects in a set associative cache, thereby allowing larger on-chip cache while maintaining acceptable manufacturing yields. The present invention can be used in combination with other methods, such as row and column redundancy, to further increase yields.

BRIEF SUMMARY OF THE INVENTION

In accordance with the present invention, there is provided a novel method and architecture for increasing the number of defects in the data array of the cache which can be absorbed while maintaining a useable cache size thereby reducing the percentage of dies which must be discarded due to manufacturing defects. This is accomplished by remapping defective portions of ways in a set associative cache to a surrogate portion of another way in the cache. By utilizing a multiplexer or comparable switching mechanism ("mux") in the shortest path between the access control logic of the microprocessor and the closest way, additional selectivity can be gained. More specifically, the mux allows smaller portions of the way to be disabled and replaced with a useable portion of a surrogate way, i.e., the way with the shortest path. Since the surrogate way has the shortest physical path, the mux can be added without adding any latency or cycle time. This allows for a larger percentage of die to be repaired, with larger useable cache remaining.

The inventive architecture for set associative cache comprises: a set associative cache having a plurality of ways wherein the ways are segmented into a plurality of banks and wherein a first way has a fast access time; access control logic which manages access to the cache and is coupled to the plurality of ways; a plurality of multiplexers coupled to the first way in each of the banks and coupled to the access control logic; wherein the access control logic controls the multiplexer in a bank to remap any defective way in a bank to the first way in that same bank.

The inventive microprocessor die of the present invention comprises: self test logic which tests the die for defects; a set associative cache having a plurality of ways wherein the ways are segmented into a plurality of banks; access control logic which manages access to the cache coupled to the self test logic and coupled to the plurality of ways in said cache; a first way in the cache which has a physically shorter path to the access control logic; a plurality of multiplexers coupled to the first way in each of the plurality of banks and coupled to the access control logic; wherein the access control logic controls the multiplexer in a bank to remap any defective way in a bank to the first way in that same bank.

The method of absorbing defects in a set associative cache according to the present invention comprises: providing a set associative cache with a plurality of ways wherein the ways are segmented into a plurality of banks and wherein a first way has a fast access time; providing a plurality of multiplexers coupled to the first way in each of said banks; and using the multiplexer in a bank to remap any defective way in a bank to the first way in that same bank.

The computer system incorporating the present invention comprises: an output device to communicate information to a user; a microprocessor comprising: a set associative cache having a plurality of ways wherein the ways are segmented into a plurality of banks; access control logic which manages access to the cache coupled to the plurality of ways in said cache; a first way in the cache which has a physically shorter path to the access control logic; a plurality of multiplexers coupled to the first way in each of the plurality of banks and coupled to the access control logic; wherein the access control logic can control the multiplexer in a bank to remap any defective way in a bank to the first way in that same bank.

BRIEF DESCRIPTION OF THE DRAWINGS

The invention can be more fully understood by referencing the accompanying drawings wherein.

NOTATION AND NOMENCLATURE

Figure 1:
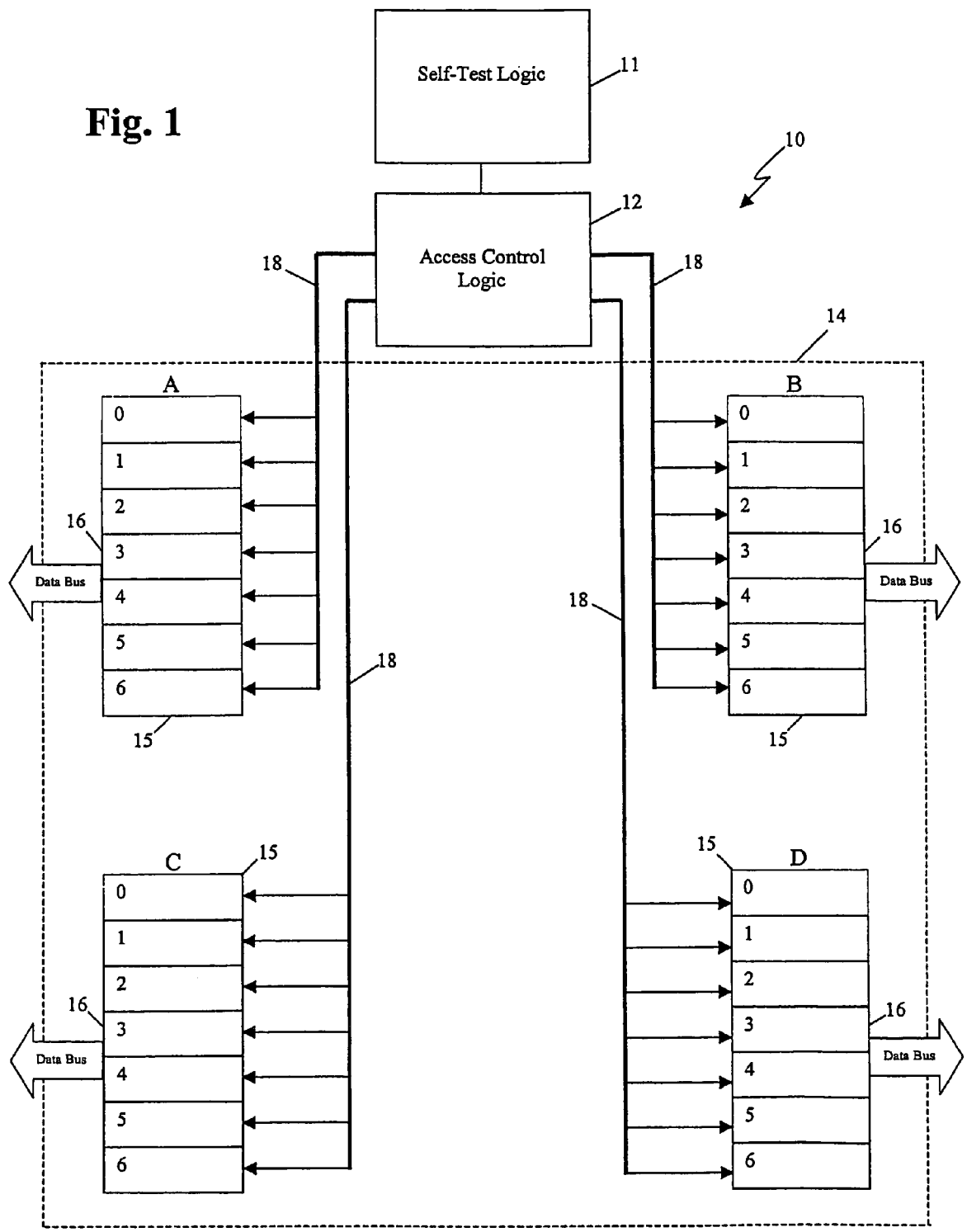
FIG. 1 shows a block diagram of the architecture relating to a data array in set associative on-chip cache on a microprocessor die.

Certain terms are used throughout the following description and claims to refer to particular system components. As one skilled in the art will appreciate, components may be referred to by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. Finally, the term "logic" is used to encompass hardware and software solutions.

DETAILED DESCRIPTION OF THE DRAWINGS

Referring now to the drawings, wherein like reference characters denote corresponding components or parts:

FIG. 1 shows a functional block diagram of the architecture 10 relating to a data array of on-chip cache on a microprocessor die where the cache is configured as a 7-way set associative cache. The access control logic 12 is the portion of the microprocessor that controls, manages and performs the reads and writes to the cache data array 14. The data array 14 is in a standard set associative cache configuration with 7-ways and is segmented into four corners or banks 15. The data is written or stored across each bank 15 in one of the seven ways 16 as shown. Thus, when data is read from the data array of the cache, the data is read from a way 16 across all of the banks 15. Any number of banks 15 can be used with a plurality of ways 16 associated across the banks 15. The embodiment illustrated in FIG. 1 incorporates four banks 15 and seven ways 16 in each bank 15. The seven ways 16 in each bank 15 are designated numerically as way 0 through way 6 as shown. The four banks 15 are designated alphabetically as bank A-D. Although the embodiment shown comprises a set associative cache having seven ways 16 and four banks 15, it is understood that the data array 14 of the cache may be segmented with any granularity between banks 15 and ways 16. Typically, the data must be segmented in some format so that the data can be read out of the cache efficiently. Data stored in large monolithic data arrays takes longer to access and thus requires longer clock cycle times. The present invention applies to any cache formatted as a set associative cache regardless of granularity.

Each way 16 in each bank 15 is coupled to the access control logic 12 such that a set hit signal or signals 18 can be sent between the data array 14 and to the access control logic 12. More specifically, signals Hit 0-Hit 6 are sent to way 0-way 6 in each bank 15 of the data array 14, respectively. A set hit signal 18 is sent from the access control logic 12 to the specific way 16 in the cache data array 14 to which data is to be read or written.

Self-test logic 11 in the microprocessor is used to determine if there is any defective portion of the microprocessor die. In manufacturing, and then subsequently on each power-up of the microprocessor (i.e., in a computer system when the power supply supplies power to the microprocessor), self-test logic built in to the processor tests for defects in the die, including in the data array of the cache. If a defect is found, the self-test logic 12 determines where the defect is located and takes appropriate corrective measures to repair the defect. Not all defects can be successfully repaired by the self-test logic 11. If the defect cannot be repaired, the location of all unrepairable defects is stored, typically in status registers. The location and number of unrepairable defects determines whether the die can be used or must be discarded.

The self-test logic 11 is coupled to the access control logic 12 both to perform the self-testing of the cache and to provide the results of the testing to the access control logic 12. As noted, generally the self test logic 11 stores the test results in status registers which the access control logic 12 can access to determine if there are any defective portions of the data array 14 of the cache. In a typical set associative cache, if there are any unrepairable defects in the data array 14, the entire way in which the defect is found must be disabled and unused. Otherwise, data stored in the defective way will be unreliable. Unfortunately, even if only one portion of the way (such as the portion of the way in one bank) were defective, normally the entire way would have to be disabled. Obviously, in a seven way associative cache such as the one shown, each defect in a separate way would disable ⅐ of the effective and usable cache size. The present invention addresses this problem and provides an alternative method of working around defects in the data array while saving more of the overall cache size.

It should be noted that in any set associative cache configuration on a microprocessor die, one way 16 will be physically closer to the portion of the access control logic 12 having final control over the access to the data array 14 of the cache. In FIG. 1, way 0 is physically closer to the access control logic 12 while way 6 has the longest physical path to the access control logic 12. In any microprocessor configuration, there will be one way which has the shortest path. This difference in path lengths provides an opportunity.

The time required to access data in the cache is often the critical time for determining how fast the microprocessor can cycle. Thus, how fast the set hit signal 18 can be sent between the access control logic 12 and the data array 14 will often set the cycle time for the microprocessor. The cycle time must be set to accommodate the slowest way, that is, the way with the longest physical path, way 6 as illustrated in FIG. 1. Accordingly since the set hit signal 18 travels a shorter distance for way 0, there is additional time to perform additional functions in way 0 without affecting cycle time or without introducing any additional latency. Given this extra time available in the shortest path, a multiplexer or comparable switching mechanism (herein collectively referred to as a "mux") can be introduced into the path of the set hit signal 18 from way 0 (i.e., the "Hit 0" signal) to the access control logic 12. So long as the additional time added by the mux ($t_{mux}$) does not make the access time for way 0 exceed the time for the longest way ($t_{way6}$) then the mux can be added without adding latency. This relationship can be expressed as:

$$t_{mux} + t_{way0} \leq t_{way6}$$

Alternatively, as long as the time added by the mux ($t_{mux}$) does not make the access time for way 0 exceed a clock cycle, then the mux can be added:

$$t_{mux} + t_{way0} \leq t_{clk}$$

Whether the time for the longest way ($t_{way6}$) or the clock cycle time ($t_{clk}$) is the critical parameter depends on the system.

It should also be noted that a mux can be added in the path of any way, not just way 0, so long as the way has sufficient extra time to accommodate the added time of the mux ($t_{mux}$). Thus, a mux can be added to a path where the access time of the way ($t_{wayn}$) plus the time added by the mux ($t_{mux}$) does not exceed the time for the longest way ($t_{way6}$), $$t_{mux} + t_{wayn} \leq t_{way6}$$

or alternatively, does not exceed a clock cycle:

$$t_{mux} + t_{wayn} \leq t_{clk}.$$

Incorporating muxes into multiple ways allows for even greater repair flexibility.

Figure 2:
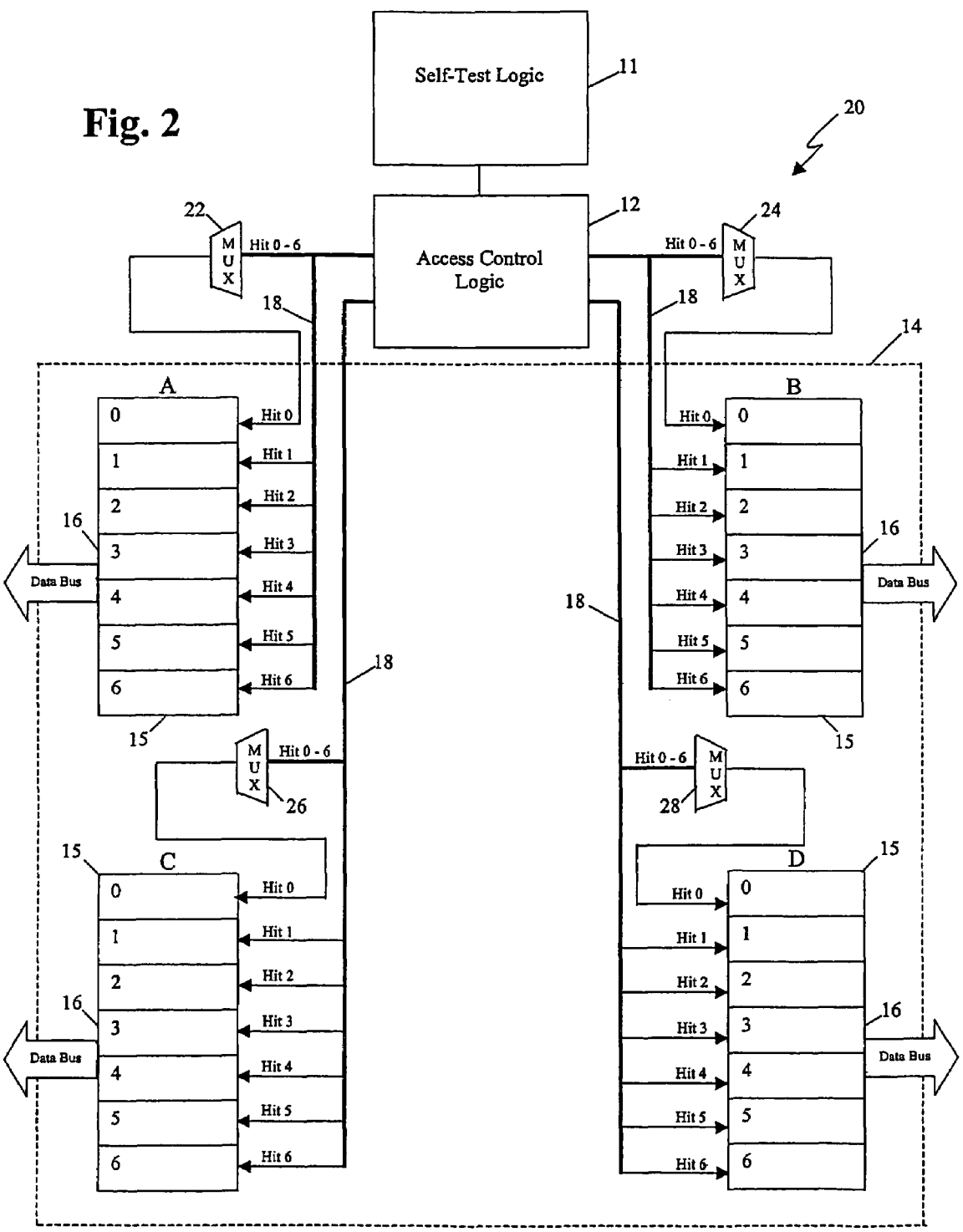
FIG. 2 shows a block diagram of the architecture relating to a data array in set associative on-chip cache on a microprocessor die as contemplated by the present invention.

FIG. 2 shows a functional block diagram of the architecture 20 relating to the data array for on-chip cache as contemplated by the present invention. Essentially, FIG. 2 illustrates the cache architecture of FIG. 1 with the addition of four multiplexers or muxes 22, 24, 26 and 28 in the path of way 0, that is, one mux in each path from way 0 in each of the four corners or banks 15. Note that a 7-way mux is used in each path because there are 7 ways in the embodiment shown. An n-way mux is required for an n-way set associative cache so that each set hit signal 18 for each way can be muxed together in the path for way 0.

FIG. 2 also denotes unrepairable defects in certain ways with an "X" shown in the defective way. In particular, way 6 of bank A and way 5 of bank D are defective and are marked with an "X". In a traditional set associative cache, these defects would require disabling way 6 and way 5 in order to ensure data is not corrupted by storing it in these defective ways. Accordingly, ⅖ of the available cache size would be disabled due to the defects.

The addition of a mux 22, 24, 26, 28 in each of the way 0 paths allows for a more efficient work around of the defects shown. The work around is implemented as follows: Way 0 is logically disabled so the access control logic 12 will not use way 0 for normal storage of data. With way 0 disabled for normal use, it can then be remapped and used as a surrogate for the defective ways in each bank using the muxes. In particular, mux 20 is set such that way 0 is used in place of defective way 6 in bank A. More specifically, the access control logic 12 sends a control signal to mux 20 such that a set hit signal 18 for way 6 (Hit 6 signal) is effectively remapped to way 0 so that way 0 will be used in place of way 6 for bank A. Correspondingly, the portion of way 6 in bank A is disabled so that it will not attempt to put its data on the data bus at the same time as way 0 in bank A. This is accomplished by sending a disable signal to the portion of way 6 in bank A. The remaining portions of way 6, i.e., those portions in banks B, C, and D, remain active. So, data is effectively read from way 0 in bank A with way 6 in banks B, C, and D.

Similarly, way 0 in bank D can be remapped such that way 0 is used in place of defective way 5 of bank D by controlling mux 28 to remap the set hit signal for way 5 (Hit 5 signal) to way 0 for bank D and disabling way 5 of bank D. As a result of the muxes 22 and 28 then, when data is read from way 5, it is actually retrieved from way 5 in banks A, B and C and way 0 in bank D. Similarly, a read from way 6 actually retrieves data from way 6 of banks B, C and D and way 0 of bank A. Thus, the portions of way 0 in the separate banks can be used in place of a defective way in each bank 15 without adding any latency to the system.

Note that in this example the defects have been successfully "absorbed" or "worked around" by only disabling one way, or ⅐ of the available cache size, instead of disabling 2 ways, or ⅔ of the available cache, as would traditionally have been required. By extension, the muxes in the paths for way 0 can be used to remap around one defective way in each bank (with a maximum of four defective ways being remapped to way 0 in a four bank architecture as shown). Accordingly, if there were defects in way 2 of bank A, way 3 of bank B, way 4 of bank C, and way 5 of bank D, each defect could be remapped via muxes 22, 24, 26, 28 to way 0 in that bank. Thus, instead of having to disable four separate ways to work around the defects, ⁴⁄₇ of the cache, all of the defects can be absorbed with only way 0 disabled for normal use, ⅐ of the available cache.

It is understood that there are limitations to the embodiment as described. For instance, if there are two defective ways in one bank, then only one of the defective ways can be remapped to way 0. In addition, if a defect occurs in way 0 then no defects in that bank can be remapped to way 0. Finally, if there is only one defective way, remapping that way to way 0 results in no savings since one way would still have to be disabled, i.e., ⅐ of the cache. Some of these limitations can be overcome, however, by placing muxes in the second (or more) shortest way, assuming its access time is fast enough such that there is enough extra time to accommodate the added time of the mux as discussed above. Having two or more ways with muxes incorporated in their paths would allow multiple defective ways in the same bank to be remapped.

Ultimately, depending on the number and location of the defects in the data array, the invention allows for more defects to be absorbed in the data array without sacrificing as much of the total available cache. This can result in resurrecting useful parts that would have been discarded in the past, thereby increasing the overall manufacturing yield for the microprocessor die. Although the invention may be used to work around more defects in the data array of the microprocessor and thus increase manufacturing yields by allowing more useable parts to be shipped, the invention is also useful for debug of the microprocessor. In particular, the invention can allow earlier debug of the microprocessor because you do not have to wait until the manufacturer has debugged the manufacturing process to obtain parts having approximately a full on-chip cache available for testing. This debug advantage alone may warrant the addition of the invention to the architecture of a microprocessor.

The above discussion is meant to be illustrative of the principles and various embodiments of the present invention. While the invention has been particularly shown and described with respect to specific embodiments thereof, numerous variations and modifications will become apparent to those skilled in the art once the above disclosure is fully appreciated. It is intended that the following claims be interpreted to embrace all such variations and modifications.

What is claimed is:

1. A novel architecture for set associative cache, comprising:
    a set associative cache having a plurality of ways wherein the ways are segmented into a plurality of banks and wherein a first way has a faster access time than the access time of the other ways of the plurality of ways;
    access control logic which manages access to the cache and is coupled to said plurality of ways, the access control logic being physically closer to the first way than the other ways of the plurality of ways;
    a plurality of muxes coupled to said first way in each of said banks and coupled to said access control logic; and
    wherein the access control logic controls the mux in a bank to remap any defective way in a bank to the first way in that same bank.

2. The architecture of claim 1 wherein said first way has said faster access time because it has a physical path to said access control logic that is shorter than the respective physical paths from the other ways of the bank to said access control logic.

3. The architecture of claim 1 further comprising self test logic coupled to said access control logic to test the cache for defects.

4. The architecture of claim 3 wherein said self test logic tests the cache for defects on power up.

5. The architecture of claim 3 wherein said self test logic stores the location of defects in a status register.

6. The architecture of claim 5 wherein said access control logic reads the location of defects in the cache from the status register to determine control of said muxes, and delivers one or more control signals to the muxes to assert said control.

7. The architecture of claim 1 wherein said set associative cache has a data array having a plurality of ways wherein the ways are segmented into a plurality of banks and wherein a first way has a faster access time than the access time of the other ways of the plurality of ways of the data array, by virtue of said access control logic being physically closer to the first way than to the other ways of the plurality of ways.

8. The architecture of claim 1 further comprising a plurality of ways having a faster access time than the access time of at least some of the other ways of the plurality of ways and a plurality of muxes coupled to said plurality of ways in each of said banks and coupled to said access control logic.

9. The architecture of claim 8 wherein the access control logic controls the plurality of muxes in a bank to remap any defective way in a bank to a different way in that same bank.

10. A microprocessor die, comprising:
    self test logic which tests the die for defects;
    a set associative cache having a plurality of ways that are each segmented into a plurality of banks;
    access control logic coupled to said self test logic and coupled to said plurality of ways in said cache;
    wherein each bank includes a first way that has a physical path to said access control logic that is shorter than the respective physical paths from the other ways of the bank to said access control logic; and
    a plurality of muxes each coupled to a corresponding first way in each of said plurality of banks and coupled to said access control logic,
    wherein the access control logic controls the mux in a bank to remap any defective way in that bank to the first way in that same bank.

11. The microprocessor die of claim 10 comprising a plurality of ways having a physical path to said access control logic that is shorter than at least some of the respective physical paths from the other ways of the bank to said access control logic, and a plurality of muxes coupled to said plurality of ways in each of said banks and coupled to said access control logic.

12. The microprocessor die of claim 11 wherein the access control logic controls the plurality of muxes in a bank to remap any defective way in a bank to a different way in that same bank.

13. A method of absorbing defects in a set associative cache, comprising:
   providing a set associative cache with a plurality of ways wherein the ways are segmented into a plurality of banks and wherein a first way in each bank has a faster access time than the access time of the other ways of the plurality of ways in each bank;
   providing a mux in each bank coupled to said first way in that bank; and
   using the mux in a bank to remap any defective way in a bank to the first way in that same bank.

14. The method of claim 13 further comprising the step of testing for errors in the cache.

15. The method of claim 13 further comprising the step of disabling a way in a bank when that way is defective.

16. The method of claim 13 comprising a plurality of ways having a faster access time than the access time of the other ways of the plurality of ways in each bank, by virtue of the physical proximity of the first way to a control logic relative to the other ways of the plurality of ways, and a plurality of muxes coupled to said plurality of ways in each of said banks said control logic controlling the muxes.

17. The method of claim 16 wherein the plurality of muxes in a bank are used to remap any defective way in a bank to a different way in that same bank.

18. A computer system, comprising:
   a power supply;
   a microprocessor comprising:
      a set associative cache having a plurality of ways that are each segmented into a plurality of banks;
      access control logic coupled to said self test logic and coupled to said plurality of ways in said cache;
      wherein each bank includes a first way segment that has a physical path to said access control logic that is shorter than the respective physical paths from the other ways of the bank to said access control logic; and
      a plurality of muxes each coupled to a corresponding first way segment in each of said plurality of banks and coupled to said access control logic,
      wherein the access control logic controls the mux in a given bank to remap any defective way segment in that bank to the first way segment in that same bank.

* * * * *

UNITED STATES PATENT AND TRADEMARK OFFICE
CERTIFICATE OF CORRECTION

PATENT NO. : 7,370,151 B2 Page 1 of 1
APPLICATION NO. : 10/690137
DATED : May 6, 2008
INVENTOR(S) : David H. Asher et al.

It is certified that error appears in the above-identified patent and that said Letters Patent is hereby corrected as shown below:

In column 8, line 11, in Claim 1, after "than" insert -- to --.

In column 10, line 4, in Claim 16, after "banks" insert -- , --.

Signed and Sealed this

Twenty-ninth Day of July, 2008

JON W. DUDAS
*Director of the United States Patent and Trademark Office*